United States Patent
Yamada

(10) Patent No.: US 10,971,237 B2
(45) Date of Patent: Apr. 6, 2021

(54) SEMICONDUCTOR DEVICE

(71) Applicant: LAPIS Semiconductor Co., Ltd., Yokohama (JP)

(72) Inventor: Takashi Yamada, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 123 days.

(21) Appl. No.: 16/434,264

(22) Filed: Jun. 7, 2019

(65) Prior Publication Data
US 2019/0385683 A1 Dec. 19, 2019

(30) Foreign Application Priority Data

Jun. 13, 2018 (JP) .............................. JP2018-112766

(51) Int. Cl.
| | |
|---|---|
| G11C 16/26 | (2006.01) |
| G06K 19/073 | (2006.01) |
| G11C 7/10 | (2006.01) |
| G11C 17/06 | (2006.01) |
| G11C 17/08 | (2006.01) |

(52) U.S. Cl.
CPC ............ *G11C 16/26* (2013.01); *G06K 19/073* (2013.01); *G11C 7/1042* (2013.01); *G11C 17/06* (2013.01); *G11C 17/08* (2013.01)

(58) Field of Classification Search
None
See application file for complete search history.

(56) References Cited

U.S. PATENT DOCUMENTS

2014/0368246 A1* 12/2014 Kim ..................... H03K 3/0375
327/202

FOREIGN PATENT DOCUMENTS

| JP | 2008-010549 A | 1/2008 |
|---|---|---|
| JP | 2010-506284 A | 2/2010 |

* cited by examiner

*Primary Examiner* — Tan T. Nguyen
(74) *Attorney, Agent, or Firm* — Rabin & Berdo, P.C.

(57) ABSTRACT

A semiconductor device has stored therein a plurality of bits of fixed data. The semiconductor device includes a plurality of memory elements that correspond, respectively, to the plurality of bits of the fixed data, and that acquire, store, and output the value of each bit received at an input terminal of each of the memory elements according to a timing signal. An initialization control unit feeds, to the plurality of memory elements, an initialization signal upon receipt of a fixed data setting signal, each of the plurality of memory elements being initialized to a state of storing a corresponding value represented by a bit of the fixed data according to the initialization signal.

15 Claims, 8 Drawing Sheets

FIG. 5

| SED | | | | | OPERATION MODE |
|---|---|---|---|---|---|
| SELA[1] | SELA[0] | SELB[1] | SELB[0] | SELC | |
| 0 | 0 | 0 | 0 | 0 | ID[8:15] ACQUISITION MODE |
| 0 | 0 | 0 | 0 | 1 | ID[0:7] ACQUISITION MODE |
| 0 | 0 | 0 | 1 | X | BA ACQUISITION MODE |
| 0 | 0 | 1 | 0 | X | SP ACQUISITION MODE |
| 0 | 0 | 1 | 1 | X | CFG ACQUISITION MODE |
| 0 | 1 | X | X | X | MEM ACQUISITION MODE |
| 1 | 0 | X | X | X | SR ACQUISITION MODE |
| 1 | 1 | X | X | X | SERIAL MODE |

X: 1 or 0

SEMICONDUCTOR DEVICE

TECHNICAL FIELD

The present invention relates to a semiconductor device, and particularly to a semiconductor device that outputs fixed data in which the data value is fixed.

BACKGROUND ART

A semiconductor device such as a semiconductor IC (integrated circuit) chip can be used to store fixed data in which a data value, such as an identifier (also referred to below as ID), is fixed. In such a case, the ID may be read out from the semiconductor device for various purposes and at various times.

Examples of IDs include chip IDs (unique IDs), device IDs (product IDs), device address codes (slave addresses), and the like.

Chip IDs are unique IDs for distinguishing individual semiconductor IC chips, which are mass produced, and the IDs indicate the number of the lot in which the chip was manufactured, the number of the wafer from which the chip was cut out, the position of the chip on the wafer (chip position), the manufacturing date, or the like (see Japanese Patent Application Laid-Open Publication No. 2008-10549, for example).

Device IDs are IDs assigned to each type of product, and unless there are revisions all mass produced semiconductor IC chips that are the same product are assigned the same ID (see Japanese Translation of PCT International Application Publication No. 2010-506284, page 14, table 6, for example).

Device address codes are IDs used in order to identify each semiconductor IC chip when constructing a system for enabling a plurality of semiconductor IC chips to communicate with each other through a bus (communication path). Where at least one of the plurality of semiconductor IC chips is a master device and other semiconductor IC chips are slave devices, the device address code is used for the master device to identify and individually control each of the slave devices.

Japanese Translation of PCT International Application Publication No. 2010-506284 proposes a flash memory control interface in which a memory controller functioning as a master device individually controls a plurality of flash memories functioning as slave devices. In the flash memory control interface, IDs generated by the memory controller itself are written to the reserved memory unit of each flash memory to set a unique device address code for each flash memory.

Also, Japanese Patent Application Laid-Open Publication No. 2008-10549 discloses a semiconductor device including a plurality of fuse elements having states (connection/disconnection) respectively corresponding to the plurality of bits indicating the ID in order to store various IDs as described above in the semiconductor IC chip, for example. The semiconductor device according to embodiments of the invention has a function of outputting the IDs stored therein to an external unit through an interface unit.

SUMMARY OF THE INVENTION

A configuration for a flash memory is known in which information data pieces read from the memory cell array thereof are outputted to an external unit in a serial signal format through an SPI (serial-parallel interface) bus, for example. Such a flash memory is provided with a parallel/serial conversion circuit (hereinafter, referred to as P/S conversion circuit) that converts the parallel format information data pieces (hereinafter referred to as read data pieces) read from the memory cell array to serial format.

The P/S conversion circuit includes a shift register constituted of a plurality of flip-flops (hereinafter referred to as FFs) that are in a cascade arrangement. Additionally, in the P/S conversion circuit, a so-called 2-to-1 selector of a 2-input selection-type that causes bits of a read data piece to be acquired by the FFs constituting the shift register is provided between FFs that are connected to each other. The 2-to-1 selector selects either one of 1 bit of the read data piece or 1 bit outputted from the previous stage FF, and supplies the bit to the next stage FF.

By this configuration, in the P/S conversion circuit, the read data piece is acquired by the shift register if the 2-to-1 selector selects the 1 bit within the read data piece. On the other hand, if the 2-to-1 selector selects the 1 bit outputted from the previous stage FF, then the read data piece acquired by the shift register is shifted 1 bit at a time and transmitted to the SPI bus in order from the last stage FF.

However, in such a system including the flash memory, there are some cases in which it is necessary to recognize the state of the flash memory during operation and the ID, which is the fixed data. It is preferable that the flash memory be provided with the function of being able to output through the SPI bus not only the read data piece but also a plurality of data pieces representing the state of the flash memory, the ID, and the like.

A configuration is adopted in which the fixed data as the ID is stored in advance in a fuse element, a non-volatile memory, or the like, and when necessary, a plurality of bits indicating this ID are read, and acquired by the P/S conversion circuit in parallel format, for example. In such a case, one possible configuration is to adopt an N-input selector (N being an integer of 3 or greater) that causes the shift register to selectively acquire the plurality of information data pieces including the state of the device as well as fixed data such as the ID, instead of the 2-to-1 selector provided between individual FFs of the P/S conversion circuit.

However, if the number of selectable inputs in the selector is increased, then the delay period in the selector increases in proportion thereto, and it is difficult to ensure a setup time for each FF.

At this time, in order to prevent erroneous operation of the FFs resulting from a lack of setup time, it is necessary to take measures such as reducing the frequency of the clock signal supplied to each FF, which would result in the problem of reduced processing speed.

Additionally, the greater the number of inputs selectable by the selector is, the greater the circuit size of the selector itself becomes, and the greater the resulting power consumption during the selection control performed by the selector is.

An object of the present invention is to provide a semiconductor device by which it is possible to set fixed data without resulting in a decrease in processing speed or an increase in power consumption.

A semiconductor device according to the present invention is a semiconductor device that uses fixed data constituted of a plurality of bits, the semiconductor device including: a plurality of memory elements that correspond, respectively, to the plurality of bits of the fixed data, and that acquire, store, and output the value of each bit received at an input terminal of each of the memory elements according to a timing signal; and an initialization control unit that feeds, to the plurality of memory elements, an initialization signal upon receipt of a fixed data setting signal, wherein each of the plurality of memory elements is initialized to a state of storing a corresponding value represented by a bit of the fixed data according to the initialization signal.

In the present invention, the plurality of memory elements that correspond, respectively, to the plurality of bits of the fixed data, and that acquire, store, and output the value of each bit received at an input terminal of each of the memory elements according to a timing signal, are initialized as follows according to a setting signal for the fixed data. That is, each of the plurality of memory elements is initialized to a state of storing a corresponding value represented by a bit of the fixed data according to the initialization signal.

As a result, it is possible to store fixed data in a plurality of memory elements without considering the setup time for the timing signal, and thus, it is possible to improve the processing speed by increasing the frequency of the timing signal.

Furthermore, it is possible to reduce the circuit size of the selector provided when selectively providing the plurality of memory elements with a plurality of information data pieces other than the fixed data, and to keep power consumption when selectively controlling the selector at a low level.

As a result, it is possible to use fixed data without resulting in a decrease in processing speed or an increase in power consumption.

BRIEF DESCRIPTION OF THE DRAWINGS

FIG. 5 shows an example of the relationship between the selection signal SED and operation modes.

DETAILED DESCRIPTION OF EMBODIMENTS

An embodiment of the present invention will be explained in detail below with reference to the drawings.

Figure 1:
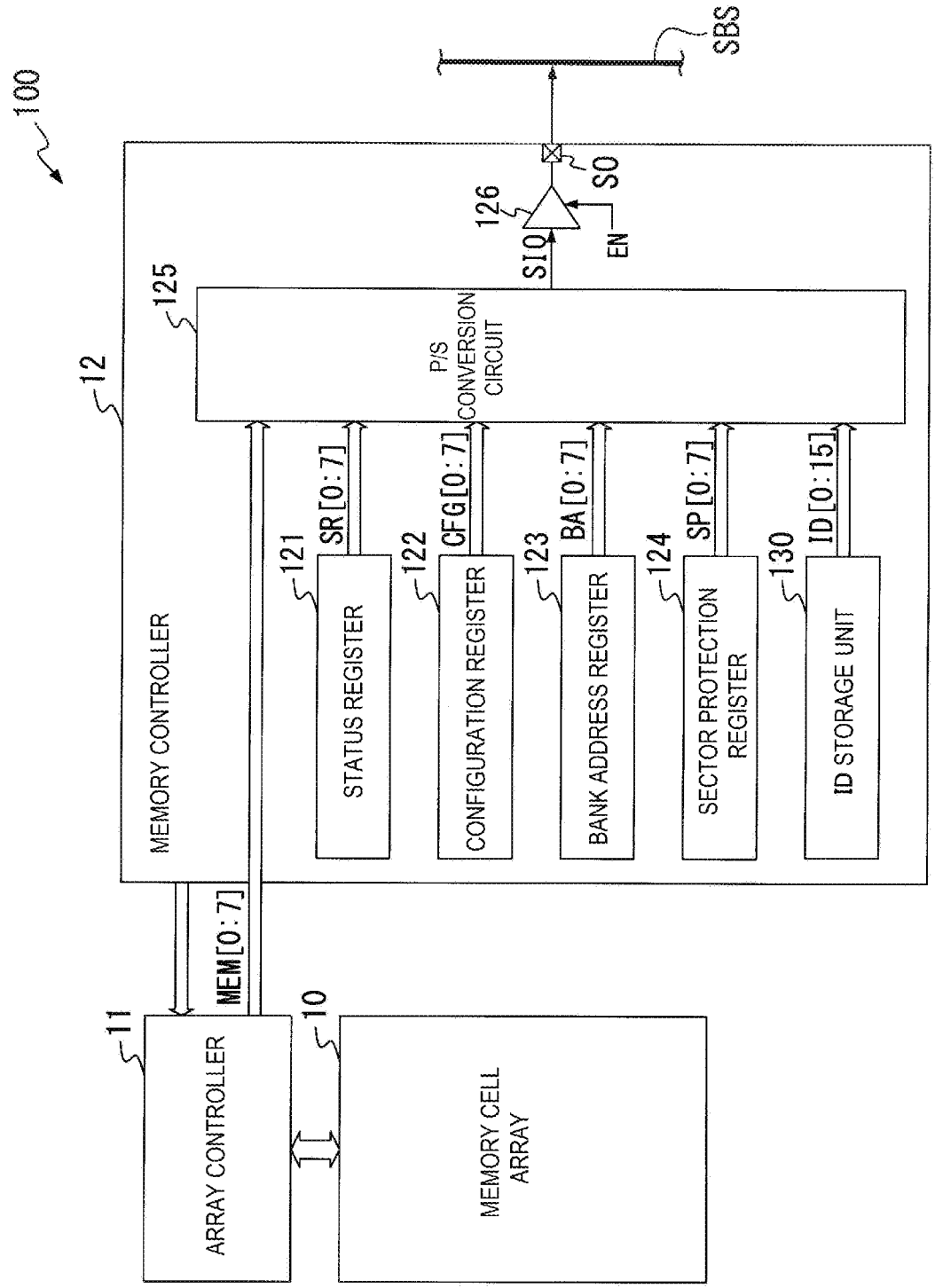
FIG. 1 is a block diagram showing the configuration of a memory unit 100 included in a semiconductor device according to the present invention.

FIG. 1 is a block diagram showing the configuration of a memory unit 100 included in a semiconductor device according to the present invention. The memory unit 100 is a NAND flash memory, for example, and includes a memory cell array 10, an array controller 11, and a memory controller 12.

The memory cell array 10 is constituted of a plurality of banks, each of which includes a plurality of memory cells.

The array controller 11 generates various voltages for writing data, reading data, or deleting data according to an address supplied from the memory controller 12 and a read command, write command, or delete command, and supplies the voltages to the memory cell group in the memory cell array 10 corresponding to the address.

Also, when the various voltages for reading data described above are supplied to the memory cell group, the array controller 11 detects the current sent from the memory cell group in the memory cell array 10 and determines the value of the read data on the basis of the detected current. Then, the array controller 11 generates the determined read data as read data MEM[0:7] indicated with 8 bits, for example, and supplies the read data to the memory controller 12.

As shown in FIG. 1, the memory controller 12 includes various registers such as a status register 121, a configuration register 122, a bank address register 123, and a sector protection register 124, as well as an ID storage unit 130. Additionally, the memory controller 12 includes a P/S (parallel/serial) conversion circuit 125 and an output buffer 126.

The status register 121 stores status data SR[0:7] that indicates the current state of the memory unit 100 in 8 bits. The configuration register 122 stores configuration data CFG[0:7] that indicates setting information for the memory control method performed by the memory controller 12 in 8 bits. The bank address register 123 stores a bank address BA[0:7] that indicates the position of each of the banks included in the memory cell array 10 in 8 bits. The sector protection register 124 stores sector protection data SP[0:7] indicating sectors to be excluded from data writing or deletion in each bank included in the memory cell array 10 in 8 bits.

The ID storage unit 130 stores an ID [0:15] included within the device ID [0:23] that indicates in 24 bits specific information of the product type of the host device. As will be described later, unlike typical examples, in the present invention, the remaining ID [16:23] is stored in a distributed manner in the P/S conversion circuit 125. In other words, according to embodiments of the invention, the memory controller 12 stores identification information, which may include chip IDs, device IDs, device address codes, or any other type of identification information as an ID, and a portion of the ID is stored in the ID storage unit 130 while a remainder of the ID is stored in a distributed manner in the P/S conversion circuit 125.

Figure 2:
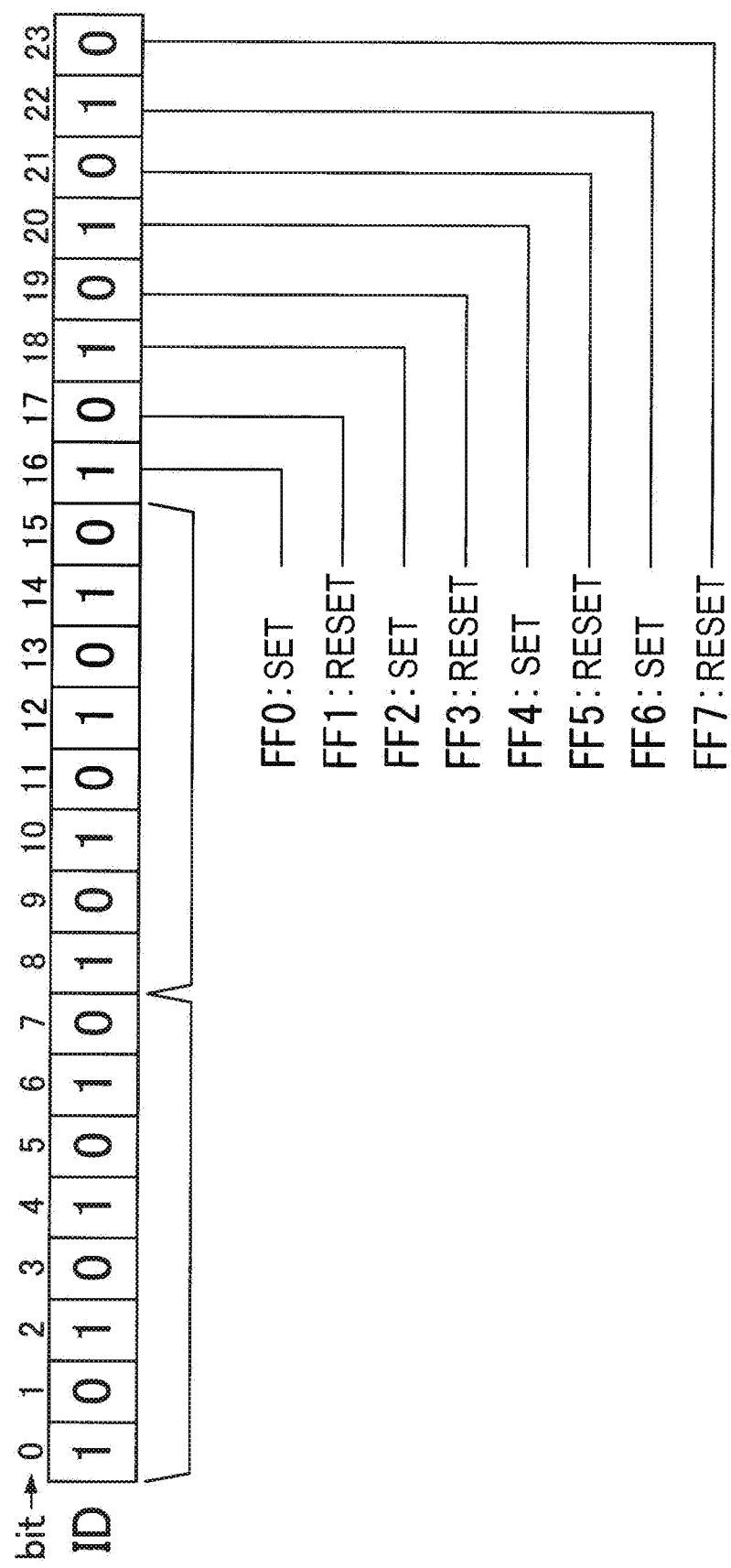
FIG. 2 is a data format diagram showing one example of a device ID [0:23].

FIG. 2 is a data format diagram showing one example of the device ID [0:23].

The ID storage unit 130 shown in FIG. 1 stores an ID [0:7] constituted of a 0th bit to a 7th bit and an ID [8:15] constituted of an 8th bit to a 15th bit, within the device ID [0:23] shown in FIG. 2, and supplies the ID [0:7] and the ID [8:15] to the P/S conversion circuit 125.

The P/S conversion circuit 125 receives the above-mentioned read data MEM[0:7], the status data SR[0:7], the configuration data CFG[0:7], the bank address BA[0:7], the sector protection data SP[0:7], and the device ID [0:15].

The P/S conversion circuit 125 first selects one group's worth of data pieces, among the above-mentioned six groups of information data pieces including the MEM[0:7], the SR[0:7], the CFG[0:7], the BA[0:7], the SP[0:7], and the ID[0:15], to be subjected to parallel/serial conversion. Next, the P/S conversion circuit 125 converts the selected one group's worth of data pieces into a serial data signal SIO for each bit, and supplies the serial data signal to the output buffer 126. The output buffer 126 sends the serial data signal SIO to a serial bus SBS through an output terminal SO according to an output enable signal EN.

Figure 3:
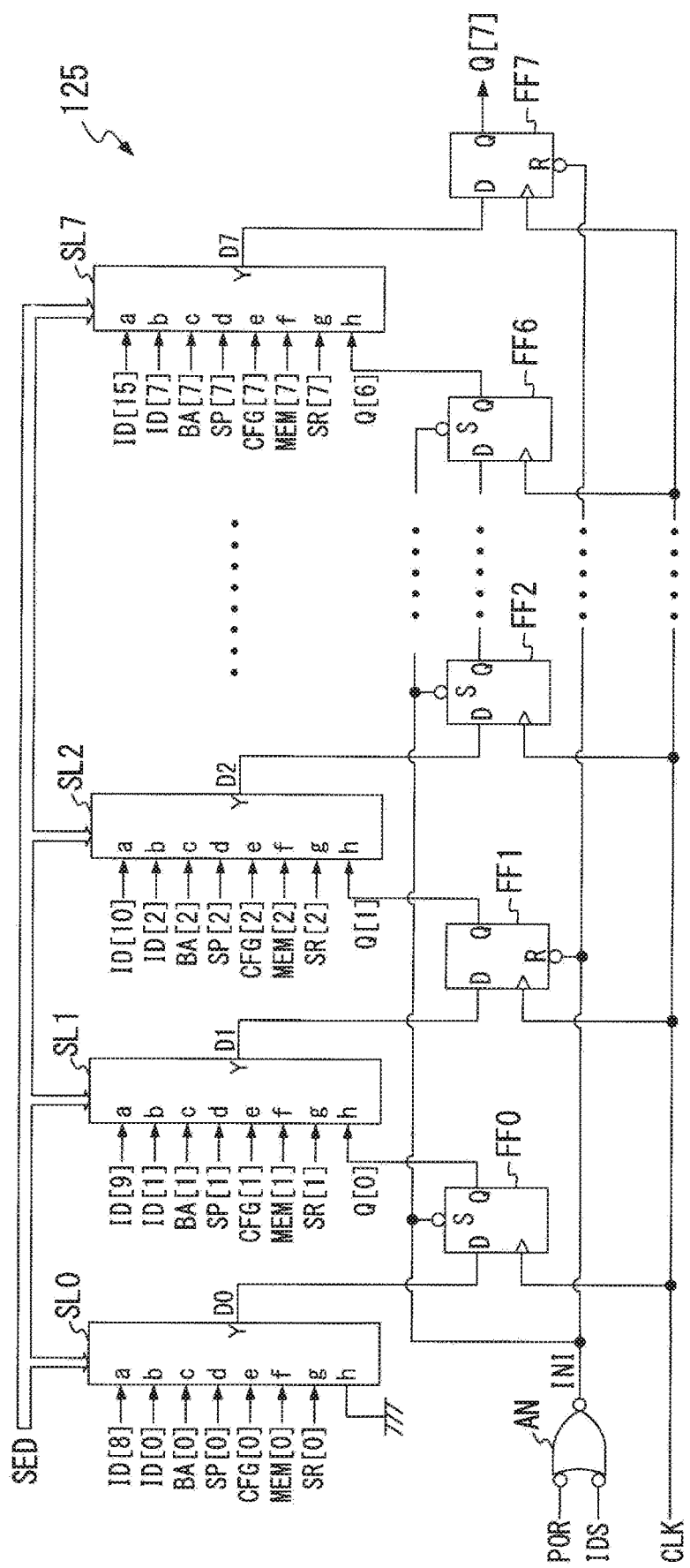
FIG. 3 is a block diagram showing one example of an internal configuration of a P/S conversion circuit 125.

FIG. 3 is a circuit diagram showing an example of an internal configuration of the P/S conversion circuit 125.

The P/S conversion circuit 125 includes a shift register including flip-flops FF0 to FF7, 8-input selectors SL0 to SL7, and an AND gate AN.

Each of the 8-input selectors SL0 to SL7 has eight input terminals (a, b, c, d, e, f, g, h). Each of the 8-input selectors SL0 to SL7 selects a data bit received by one input terminal selected according to a selection signal SED, among the input terminals a to h, and outputs the data bit to an output terminal Y. The selection signal may be a control signal provided by a memory control device or processor (not shown), for example, or it may be provided from the array controller 11.

Figure 4:
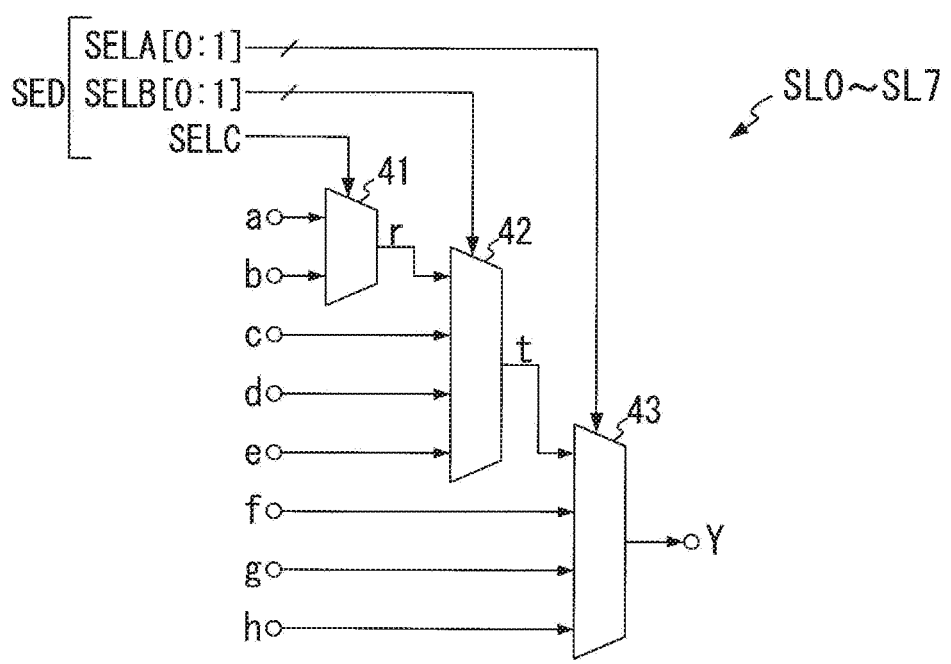
FIG. 4 is a block diagram showing an example of an internal configuration of each 8-input selector SL0 to SL7.

FIG. 4 is a circuit diagram showing one example of an internal configuration of each 8-input selector SL0 to SL7. As shown in FIG. 4, each 8-input selector SL0 to SL7 has a 2-input selector 41 and 4-input selectors 42 and 43. The selection signal SED is constituted of five selection bits (SELA[0], SELA[1], SELB[0], SELB[1], SELC) as shown in FIG. 4.

The 2-input selector 41 selects the data bit received by the input terminal a or the data bit received by the input terminal b on the basis of the binary (logic level of 0 or 1) value of the selection bit SELC, and supplies this data bit as a selection data bit r to the 4-input selector 42 in the next stage.

The 4-input selector 42 selects one of the selection data bit r, the data bit received by the input terminal c, the data bit received by the input terminal d, and the data bit received by the input terminal e on the basis of the binary values of the selection bits SELB[0] and SELB[1]. The 4-input selector 42 supplies the one selected data bit as a selection data bit t to the 4-input selector 43 in the next stage.

The 4-input selector 43 selects one of the selection data bit t, the data bit received by the input terminal f, the data bit received by the input terminal g, and the data bit received by the input terminal h on the basis of the binary values of the selection bits SELA[0] and SELA[1]. The 4-input selector 43 outputs the one selected data bit as a selection data bit through the output terminal Y.

The input terminals a of the 8-input selectors SL0 to SL7, each of which has the configuration shown in FIG. 4, respectively receive as data bits the device ID [8], ID[9], ID[10], ID[11], ID[12], ID[13], ID[14], and ID[15], as shown in FIG. 3.

The input terminals b of the 8-input selectors SL0 to SL7 respectively receive as data bits the device ID [0], ID[1], ID[2], ID[3], ID[4], ID[5], ID[6], and ID[7], as shown in FIG. 3.

The input terminals c of the 8-input selectors SL0 to SL7 respectively receive as data bits the bank addresses BA[0], BA[1], BA[2], BA[3], BA[4], BA[5], BA[6], and BA[7], as shown in FIG. 3.

The input terminals d of the 8-input selectors SL0 to SL7 respectively receive as data bits the sector protection data SP[0], SP[1], SP[2], SP[3], SP[4], SP[5], SP[6], and SP[7], as shown in FIG. 3.

The input terminals e of the 8-input selectors SL0 to SL7 respectively receive as data bits the configuration data CFG[0], CFG[1], CFG[2], CFG[3], CFG[4], CFG[5], CFG[6], and CFG[7], as shown in FIG. 3.

The input terminals f of the 8-input selectors SL0 to SL7 respectively receive as data bits the read data MEM[0], MEM[1], MEM[2], MEM[3], MEM[4], MEM[5], MEM[6], and MEM[7], as shown in FIG. 3.

The input terminals g of the 8-input selectors SL0 to SL7 respectively receive as data bits the status data SR[0], SR[1], SR[2], SR[3], SR[4], SR[5], SR[6], and SR[7], as shown in FIG. 3.

By the above configuration the 8-input selector SL0 selects one of the above-mentioned ID[8], ID[0], BA[0], SP[0], CFG[0], MEM[0], and SR[0] according to the selection signal SED (SELA[0], SELA[1], SELB[0], SELB[1], SELC). The 8-input selector SL0 supplies to the input terminal D of the flip-flop FF0, the selected ID[8], ID[0], BA[0], SP[0], CFG[0], MEM[0], or SR[0] as a data bit D0. The input terminal h of the 8-input selector SL0 is unused, and thus, is supplied ground potential.

The flip-flop FF0 acquires the data bit D0 at the rising edge of a clock signal CLK, which is a timing signal, and supplies an output signal Q[0] of the flip-flop FF0 to the input terminal h of the 8-input selector SL1.

The 8-input selector SL1 selects any of the above-mentioned ID[9], ID[1], BA[1], SP[1], CFG[1], MEM[1], SR[1], and the data bit Q[0] supplied from the flip-flop FF0 according to the selection signal SED. The 8-input selector SL1 supplies to the input terminal D of the flip-flop FF1, the selected ID[9], ID[1], BA[1], SP[1], CFG[1], MEM[1], SR[1], or Q[0] as a data bit D1.

The flip-flop FF1 acquires the data bit D1 at the rising edge of the clock signal CLK, and supplies an output signal Q[1] of the flip-flop FF1 to the input terminal h of the 8-input selector SL2.

Similarly thereafter, the 8-input selector SLw (where w is an integer of 2-7) selects any of the above-mentioned ID[w+8], ID[w], BA[w], SP[w], CFG[w], MEM[w], SR[w], and the data bit Q[w−1] supplied from the flip-flop FF[w−1] according to the selection signal SED. The 8-input selector SLw supplies to the input terminal D of the flip-flop FFw, the selected ID[w+8], ID[w], BA[w], SP[w], CFG[w], MEM[w], SR[w], or the data bit supplied from the flip-flop FF[w−1] as a data bit Dw.

The flip-flop FFw acquires and retains the data bit Dw at the rising edge of the clock signal CLK, and (excluding FF7) supplies an output signal Q[w] of the flip-flop FFw to the input terminal h of the 8-input selector SLw+1.

The flip-flop FF7, which is the last stage of the shift register, acquires and retains the data bit D7 at the rising edge of the clock signal CLK, and outputs the data bit as the data bit Q[7]. The P/S conversion circuit 125 outputs the data bit Q[7] outputted from the flip-flop FF7 as the serial data signal SIO.

Among the flip-flops FF0 to FF7, the flip-flops FF0, FF2, FF4, and FF6 each have a set terminal S, whereas the flip-flops FF1, FF3, FF5, and FF7 have a reset terminal R.

In other words, when an initialization signal INI with a logic level of 0 is supplied to the set terminal S of each of the flip-flops FF0, FF2, FF4, and FF6, the flip-flops are initialized to a set state, that is, a state in which a data bit with a logic level of 1 is retained. On the other hand, when an initialization signal INI with a logic level of 0 is supplied to the reset terminal R of each of the flip-flops FF1, FF3, FF5, and FF7, the flip-flops are initialized to a reset state, or in other words, a state in which a data bit with a logic level of 0 is retained. The flip-flops FF0 to FF7 receive the initialization signals INI at times that are not synchronized to the clock signal CLK, and are initialized to a set state or a reset state as described above according to the initialization signal INI.

The AND gate AN receives a power on reset signal POR and an ID setting signal IDS. The power on reset signal POR stays at a logic level of 0, which prompts initialization of flip-flops for only a prescribed period, and then stays at a logic level of 1 when the memory unit 100 is powered on. The ID setting signal IDS is a signal that is not synchronized to the clock signal CLK, and that corresponds to the ID read command signal supplied from a source external to the memory unit 100, for example. If the ID setting signal IDS is at a logic level of 0, for example, then among the device ID [0:23] shown in FIG. 2, the values (logic level of 0 or 1) of the ID [16:23] are set to the flip-flops FF0 to FF7.

If either one of the power on reset signal POR and the ID setting signal IDS is at a logic level of 0, then the AND gate AN generates an initialization signal at a logic level of 0, which prompts initialization. The AND gate AN supplies the initialization signal INI to the set terminals S of the flip-flops FF0, FF2, FF4, and FF6, and to the reset terminals R of the flip-flops FF1, FF3, FF5, and FF7.

Below, operations of the P/S conversion circuit 125 shown in FIG. 3 will be described.

The P/S conversion circuit 125 operates in an operation mode set according to the selection signal SED.

FIG. 5 shows an example of the relationship between the selection signal SED (SELA[1], SELA[0], SELB[1], SELB[0], SELC) and operation modes set according to the selection signal SED.

As shown in FIG. 5, for example, when MEM acquisition mode is selected according to the selection signal SED, the 8-input selectors SL0 to SL7 supply to the input terminals D of the flip-flops FF0 to FF7 the read data MEM[0:7] received by the input terminals f. As a result, the pieces of read data MEM[0:7] read from the memory cell array 10 are acquired by the shift register (FF0-FF7) in a parallel manner.

After acquisition is complete, when serial mode shown in FIG. 5 is selected according to the selection signal SED, the 8-input selectors SL1 to SL7 supply to the input terminals D1 to D7 of the next stage flip-flops FF1 to FF7 the data bits Q[0:6] of the previous stage flip-flops FF0 to FF6 received by the input terminals h. As a result, each flip-flop of the shift register (FF0-FF7) causes the acquired 8-bit read data MEM[0:7] to be shifted by 1 bit each by the next stage flip-flop in synchronization with the rising edge of the clock signal CLK, and outputs the resultant data as the serial data signal SIO from the last stage flip-flop FF7.

As a result, when MEM acquisition mode is selected according to the selection signal SED and serial mode continues to be selected, the P/S conversion circuit 125 successively outputs 1 bit at a time the read data MEM[0:7] outputted from the array controller 11 as the serial data signal SIO generated by converting the read data to a serial format.

Similarly, when BA acquisition mode and serial mode are successively selected according to the selection signal SED, the P/S conversion circuit 125 successively outputs 1 bit at a time the bank address BA[0:7] stored in the bank address register 123 as the serial data signal SIO generated by converting the bank address to a serial format.

Also, when SP acquisition mode and serial mode are successively selected according to the selection signal SED, the P/S conversion circuit 125 successively outputs 1 bit at a time the sector protection data SP[0:7] stored in the array controller 124 as the serial data signal SIO generated by converting the sector protection data to a serial format.

Also, when CFG acquisition mode and serial mode are successively selected according to the selection signal SED, the P/S conversion circuit 125 successively outputs 1 bit at a time the configuration data CFG[0:7] stored in the configuration register 122 as the serial data signal SIO generated by converting the configuration data to a serial format.

Also, when SR acquisition mode and serial mode are successively selected according to the selection signal SED, the P/S conversion circuit 125 successively outputs 1 bit at a time the status data SR[0:7] stored in the status register 121 as the serial data signal SIO generated by converting the status data to a serial format.

However, the P/S conversion circuit 125 converts the 24-bit device ID [0:23] as fixed data to a serial format by the following method and outputs the device ID.

Figure 6:
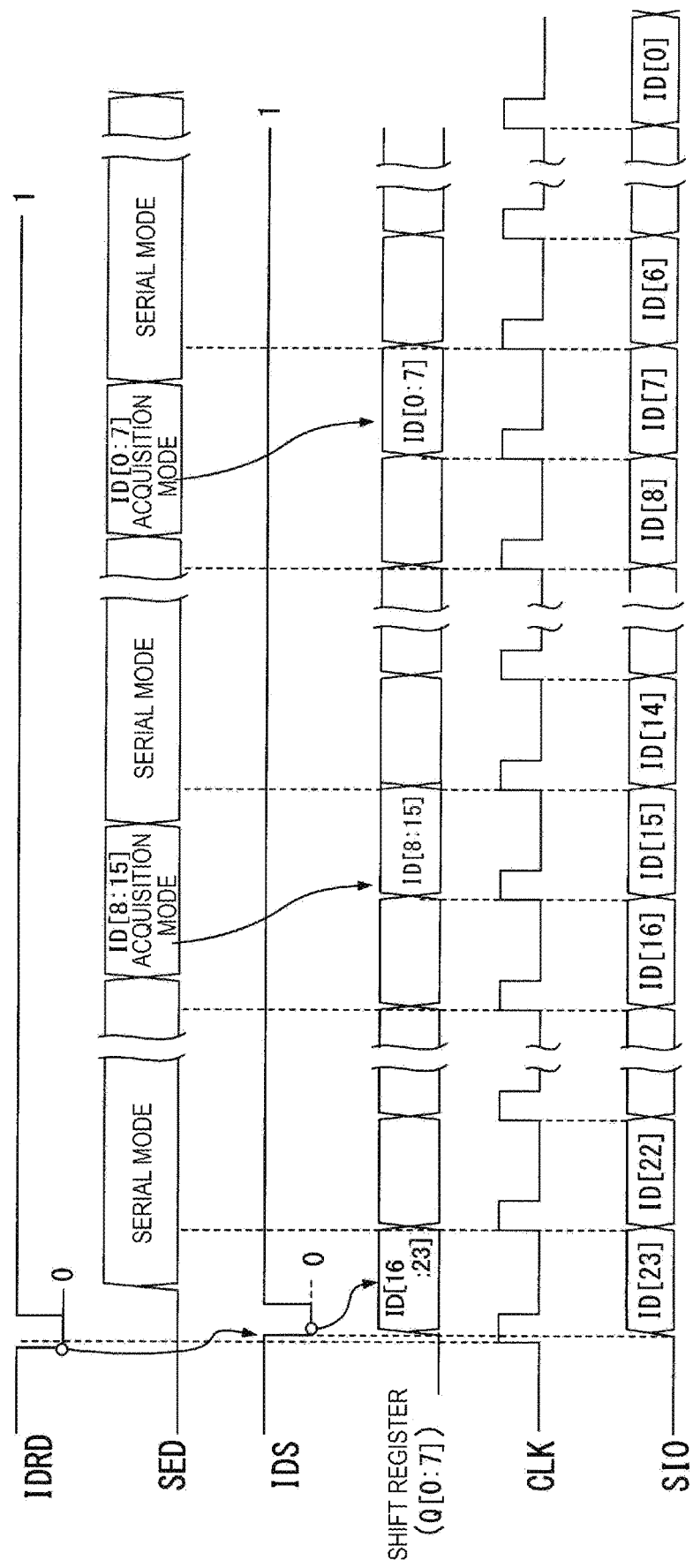
FIG. 6 is a time chart showing an example of an internal operation in the P/S conversion circuit 125.

FIG. 6 is an example of a timing chart for an internal operation performed when the P/S conversion circuit 125 converts the device ID [0:23] to a serial format and outputs the device ID as the serial data signal SIO.

As shown in FIG. 6, when an ID read command signal IDRD is received from outside the memory unit 100, the P/S conversion circuit 125 has inputted thereto the ID setting signal IDS at a logic level of 0, which causes the device ID to be set as the fixed data, according to the ID read command signal IDRD. As a result, the flip-flops FF0, FF2, FF4, and FF6 shown in FIG. 3 are initialized to the set state, and the flip-flops FF1, FF3, FF5, and FF7 are initialized to the reset state. In other words, as a result of initialization, the 8-bit device ID [16:23] corresponding to the 16th to 23rd bits of the device ID shown in FIG. 2 is acquired by the flip-flops FF0 to FF7.

The serial mode continues to be set according to the selection signal SED. As a result, the shift register (FF0-FF7) outputs 1 bit at a time the acquired device ID [16:23] in the order of the ID[23], ID[22], ID[21], ID[20], ID[19], ID[18], ID[17], and ID[16] as shown in FIG. 6, in synchronization with the rising edge of the clock signal CLK, as the serial data signal SIO.

When the device ID [16] is outputted, then as shown in FIG. 6, the ID[8:15] acquisition mode continues to be designated according to the selection signal SED. At this time, the 8-input selectors SL0 to SL7 supply to the input terminals D0 to D7 of the flip-flops FF0 to FF7 the device ID received by the input terminals a, that is, the device ID [8:15] corresponding to the 8th to 15th bits of the device ID shown in FIG. 2. As a result, the device ID [8:15] stored in the ID storage unit 130 is acquired by the shift register (FF0-FF7) at the rising edge of the clock signal CLK following the rising edge when outputting the device ID [16] as shown in FIG. 6.

After acquisition, the serial mode is set according to the selection signal SED as shown in FIG. 6. At this time, the 8-input selectors SL1 to SL7 supply to the input terminals D1 to D7 of the next stage flip-flops FF1 to FF7 the data bits Q[0:6] outputted from the previous stage flip-flops FF0 to FF6 received by the input terminals h.

As a result, the shift register outputs 1 bit at a time the 8-bit device ID [8:15] in the order of the ID[15], ID[14], ID[13], ID[12], ID[11], ID[10], ID[9], and ID[8] as shown in FIG. 6, in synchronization with the rising edge of the clock signal CLK, as the serial data signal SIO.

When the device ID [8] is outputted, then as shown in FIG. 6, the ID[0:7] acquisition mode continues to be designated according to the selection signal SED. At this time, the 8-input selectors SL0 to SL7 supply to the input terminals D0 to D7 of the flip-flops FF0 to FF7 the device ID received by the input terminals b, that is, the device ID [0:7] corresponding to the 0th to 7th bits of the device ID shown in FIG. 2. As a result, the device ID [0:7] stored in the ID storage unit 130 is acquired by the shift register (FF0-FF7) at the rising edge of the clock signal CLK following the rising edge when outputting the device ID [8] as shown in FIG. 6.

After acquisition, the serial mode is set according to the selection signal SED as shown in FIG. 6. At this time, the 8-input selectors SL1 to SL7 supply to the input terminals D1 to D7 of the next stage flip-flops FF1 to FF7 the data bits Q[0:6] outputted from the previous stage flip-flops FF0 to FF6 received by the input terminals h.

As a result, the shift register outputs 1 bit at a time the 8-bit device ID [0:7] in the order of the ID[7], ID[6], ID[5], ID[4], ID[3], ID[2], ID[1], and ID[0] as shown in FIG. 6, in synchronization with the rising edge of the clock signal CLK, as the serial data signal SIO.

As described above, in the P/S conversion circuit 125, in converting the device ID [0:23] as fixed data to a serial format and outputting it, first, signals are supplied through the selectors (SL0 to SL7) to the input terminals D0 to D7 of the flip-flops FF0 to FF7 for the device ID [0:7] or [8:15]. As a result, the flip-flops FF0 to FF7 acquire the values of the 8-bit device ID [0:7] or [8:15] in a parallel manner at the rising edge of the clock signal CLK. The shift register constituted of the flip-flops FF0 to FF7 outputs 1 bit at a time the acquired 8-bit device ID [0:7] or [8:15] successively in synchronization with the rising edge of the clock signal CLK, as the serial data signal SIO.

On the other hand, the device ID [16:23] is acquired by and stored in the flip-flops FF0 to FF7 without passing through the selectors (SL0 to SL7) by initialization of the reset terminal R or the set terminal S of the flip-flops FF0 to FF7. The shift register (FF0 to FF7) outputs 1 bit at a time the set 8-bit device ID [16:23] successively in synchronization with the rising edge of the clock signal CLK, as the serial data signal SIO.

Thus, in the P/S conversion circuit 125, of the 24-bit device ID [0:23], the 8-bit device ID [16:23], for which there is no margin for setup time for the flip-flops to read the ID read command signal IDRD shown in FIG. 6 immediately after receipt thereof, is acquired by the shift register (FF0 to FF7) by asynchronous initialization without depending on the clock signal CLK. As a result, when the shift register (FF0 to FF7) acquires the device ID [16:23], there is no need to consider setup time in relation to the clock signal CLK. Therefore, it is possible to acquire and store the device ID [16:23] in the shift register (FF0 to FF7) without lowering the frequency of the clock signal CLK, and output the device ID in a serial manner.

If the configuration shown in FIG. 4 is used for the 8-input selectors SL0 to SL7, then the device ID [8:15] fed to the input terminal a would pass through three stages of selectors (41, 42, 43) and be fed to the input terminal D of each of the flip-flops FF0 to FF7. Similarly, the device ID [0:7] fed to the input terminal b would pass through three stages of selectors (41, 42, 43) and be fed to the input terminal D of each of the flip-flops FF0 to FF7.

As a result, in order for the shift register (FF0 to FF7) to acquire the device ID [8:15] or [0:7], there is a need to factor in the delay time in the three stages of selectors (41, 42, 43) and ensure a setup time for the selection signal SED at the rising edge of the clock signal CLK.

As shown in FIG. 5, selection of serial mode by the selection signal SED depends only on the selection bit SELA [0:1], and the selection bits SELB[0:1] and SELC are not relevant.

In order to enact the ID [8:15] acquisition mode shown in FIG. 6, when executing serial mode immediately prior thereto, the SELB [0:1] and the SELC are both set to a logic level of 0 as shown in FIG. 5. Also, in order to enact the ID [0:7] acquisition mode shown in FIG. 6, when executing serial mode immediately prior thereto, the SELB [0:1] is set to a logic level of 0 and the SELC is set to a logic level of 1 as shown in FIG. 5.

As a result, the delay time at each of the 8-input selectors SL0 to SL7 during acquisition of the device ID [0:7] or [8:15] is in reality only for one stage of the 4-input selector 43 shown in FIG. 4.

Thus, according to the P/S conversion circuit 125, it is possible to output a fixed data piece (ID) serially at an equivalent speed to the reading speed for other information data pieces (ID, BA, SP, CFG, MEM, SR).

Also, in the P/S conversion circuit 125, the device ID [16:23] among the device ID [0:23] is acquired by the shift register without passing through the 8-input selectors (SL0-SL7).

Thus, compared to a typical P/S conversion circuit in which the selector selects not only the device ID [0:15] but also the device ID [16:23], it is possible to use a smaller circuit for the selector. Furthermore, it is possible to reduce power consumption by an amount proportional to the amount of control that is no longer needed to be performed by the selection signal SED to select the device ID [16:23].

Thus, according to the P/S conversion circuit 125, it is possible to selectively output a plurality of information data pieces (ID, BA, SP, CFG, MEM, SR) including a fixed data piece (ID) in a serial manner without resulting in decreased processing speed, increased power consumption, or increased chip area.

In the example shown in FIG. 3, the flip-flops FF0, FF2, FF4, and FF6 have set terminals and FF1, FF3, FF5, and FF7 have reset terminals in correspondence to the 8 bits 10101010 represented in the device ID [16:23] as shown in FIG. 2.

In other words, whether the flip-flops FF0 to FF7 have a set terminal or a reset terminal is determined by the value of each bit in the device ID [16:23].

Essentially, the 16th to 23rd bits of the device ID [0:23] correspond to the flip-flops FF0 to FF7 in the following way.

16th bit: FF0
17th bit: FF1
18th bit: FF2
19th bit: FF3
20th bit: FF4
21st bit: FF5
22nd bit: FF6
23rd bit: FF7

Here, flip-flops corresponding to the bits indicating a logic level of 0 (first value) among the 16th to 23rd bits of the device ID [0:23] have reset terminals, and flip-flops corresponding to bits having a logic level of 1 (second value) have set terminals.

However, the flip-flops FF0 to FF7 may each have both a set terminal and a reset terminal.

Figure 7:
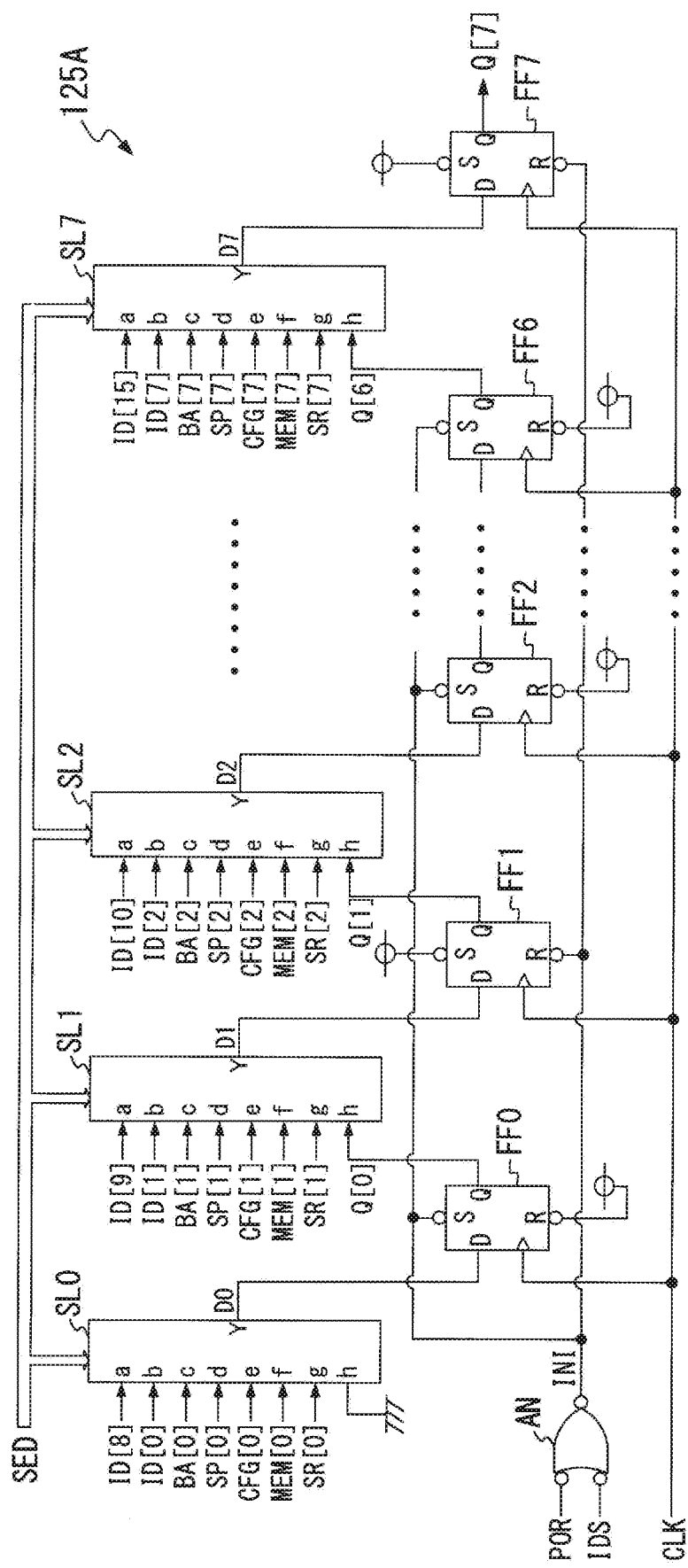
FIG. 7 is a block diagram showing a modification example of an internal configuration of the P/S conversion circuit 125.

FIG. 7 is a circuit diagram showing a P/S conversion circuit 125A as a modification example of the P/S conversion circuit 125 that was made taking into consideration the aforementioned points. In the configuration shown in FIG. 7, the same configuration is used as that of FIG. 3 aside from the flip-flops FF0 to FF7.

In the configuration shown in FIG. 7, the flip-flops FF0 to FF7 each have both a set terminal S and a reset terminal R. In such a case, the initialization signal INI is received by the set terminals S of the flip-flops FF0, FF2, FF4, and FF6, and by the reset terminals R of the flip-flops FF1, FF3, FF5, and FF7. The reset terminals R of the flip-flops FF0, FF2, FF4, and FF6, and the set terminals S of the flip-flops FF1, FF3, FF5, and FF7 are not used, and thus, a power source potential is applied to those reset terminals R and set terminals S.

According to the configuration shown in FIG. 7, it is possible to select whether to use the reset terminal R or the set terminal S on the basis of the value of each bit of the device ID [16:23], and thus, it is possible to flexibly handle changes in the device ID or the like.

In the examples shown in FIGS. 3 and 7, the ID setting signal IDS is switched to a logic level of 0 as shown in FIG. 6 only when setting the device ID [16:23] in the shift register (FF0-FF7). However, when the P/S conversion circuit 125 or 125A is not in operation, the ID setting signal IDS may be constantly fixed to a logic level of 0.

When forwarding of the read data MEM[0:7] read from the memory cell array 10, the device ID [0:7], or the like in serial mode is complete, then the outputs of the flip-flops FF0 to FF7 with the ID setting signal IDS at a logic level of 0 may be initialized to be the same as the respective values of the device ID [16:23] until the start of the next read operation.

Also, in the examples shown in FIGS. 3 and 7, the P/S conversion circuits 125 and 125A output to an external unit the serial data signal SIO generated by selecting one of the plurality of information data pieces (ID, BA, SP, CFG, MEM, SR) and converting it to a serial format.

However, the present invention can be applied not only to a semiconductor device provided with a serial interface such as an SPI or an I²C (inter-integrated circuit), or a parallel/serial converter, but also to a semiconductor device provided with a parallel interface.

Figure 8:
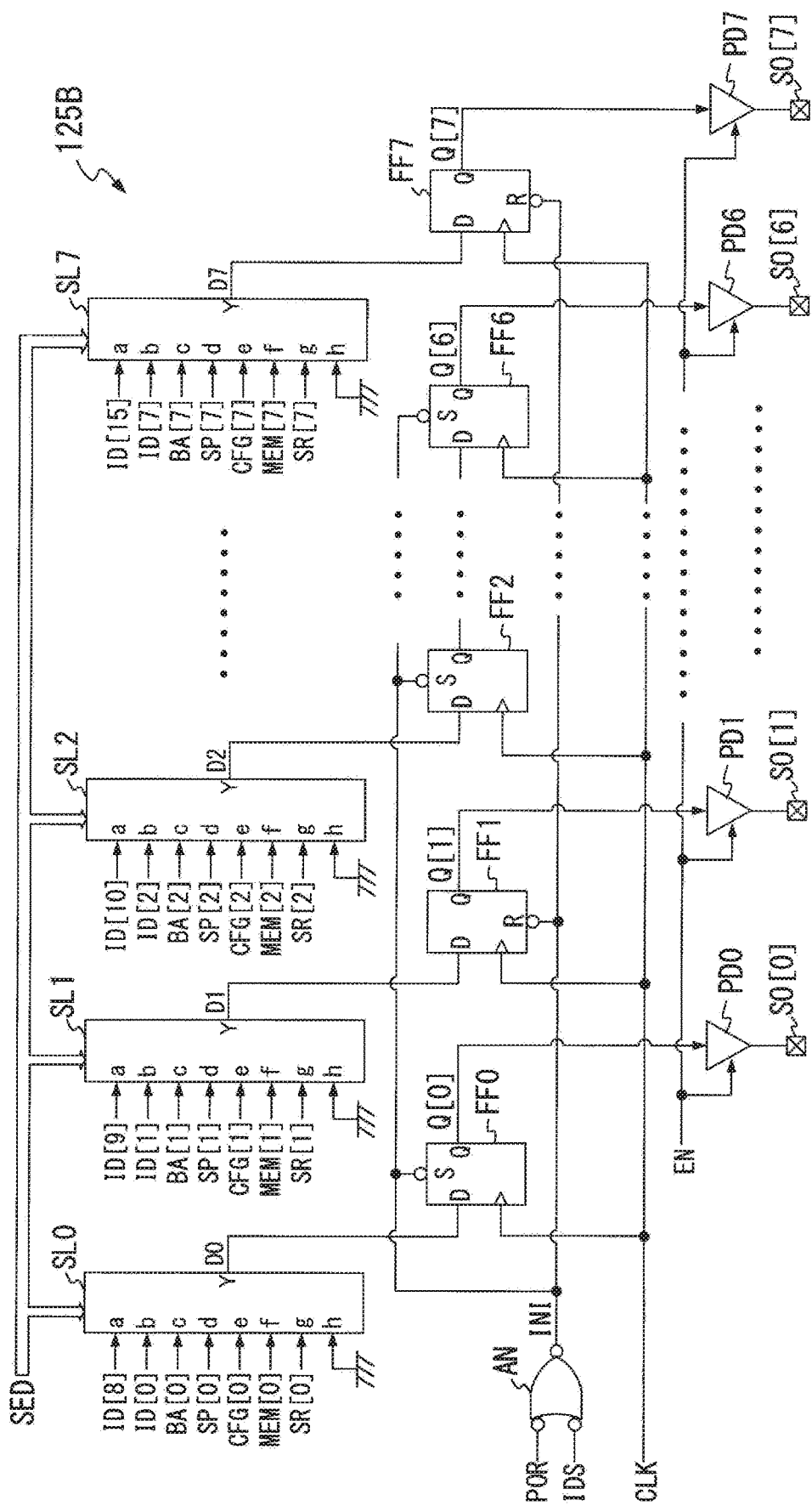
FIG. 8 is a block diagram showing another modification example of an internal configuration of the P/S conversion circuit 125.

For example, a configuration such as that of a P/S conversion circuit 125B shown in FIG. 8 may be adopted in which output buffers PD0 to PD7 and eight output terminals SO[0:7] corresponding to each output Q[0:7] from the flip-flops FF0 to FF7 are provided, and information data pieces acquired by the flip-flops FF0 to FF7 are outputted to an external unit in a parallel manner through the eight output terminals [0:7]. The output buffers PD0 to PD7 output each output Q[0:7] from the flip-flops FF0 to FF7 through the output terminals SO[0:7] according to the output enable signal EN.

Also, in the examples shown in FIGS. 3, 7, and 8, the P/S conversion circuits 125, 125A, and 125B use eight flip-flops as a group of memory elements that acquire one of the plurality of information data pieces (ID, BA, SP, CFG, MEM, SR). However, latches may be used instead of flip-flops. In such a case, each latch acquires an inputted data bit only when the clock signal CLK is at one logic level among 0 or 1, and stores the acquired data bit while the clock signal CLK is at the other logic level. Such a memory element group may be constituted of both latches and flip-flops. That is, any configuration may be adopted as long as each element acquires and stores the value of each bit according to the clock signal CLK, and information data pieces are outputted through a plurality of memory elements that output each bit.

Also, in the example above, the information data piece set by initializing each flip-flop (or latch) is the device ID, but IDs other than the device ID or other information data pieces may be set by initializing the flip-flops (or latches). That is, any configuration may be adopted as long as the information data set by initialization of each flip-flop (latch) is fixed data for which the data value does not change during operation of the semiconductor device.

In the examples described above, the device ID has 24 bits and other information data pieces (BA, SP, CFG, MEM, SR) other than the device ID are 8 bits, but the number of bits is not limited to 8 or 24. If the number of bits of the device ID, which is fixed data, is 8, which is the same as the number of flip-flops FF0 to FF7, then acquisition of the device ID is completed by only initializing the flip-flops FF0 to FF7. Thus, in such a case, it is possible to use a 6-input selector instead of the 8-input selectors SL0 to SL7. Similarly, the number of flip-flops (or latches) is not limited to eight as long as a plurality thereof (two or more) are provided.

Essentially, any configuration may be adopted for the semiconductor device of the present invention as long as a plurality of memory elements and an initialization control unit are included for outputting fixed data (ID) constituted of a plurality of bits.

That is, the plurality of memory elements (flip-flops and latches, for example) correspond, respectively, to the plurality of bits of the fixed data (ID), and acquire, store, and output the value of each bit received at the input terminal of each of the memory elements according to the timing signal. The initialization control unit (AN) feeds, to the plurality of memory elements, the initialization signal upon receipt of a fixed data setting signal (IDS). In such a case, each of the plurality of memory elements is initialized to a state of storing a corresponding value represented by bits of fixed data according to the initialization signal.

DESCRIPTION OF REFERENCE CHARACTERS

10 memory cell array
11 array controller
12 memory controller
121 status register
122 configuration register
123 bank address register
124 sector protection register
125, 125A, 125B P/S conversion circuit
130 ID storage unit
FF0-FF7 flip-flop
SL0-SL7 8-input selector

What is claimed is:

1. A semiconductor device having stored therein a plurality of bits of fixed data, the semiconductor device comprising:
   a plurality of memory elements that correspond, respectively, to the plurality of bits of the fixed data, and that acquire, store, and output a value of each bit received at an input terminal of each of the memory elements according to a timing signal; and
   an initialization control unit that feeds, to the plurality of memory elements, an initialization signal upon receipt of a fixed data setting signal,
   wherein each of the plurality of memory elements is initialized to a state of storing a corresponding value represented by a bit of the fixed data according to the initialization signal.

2. The semiconductor device according to claim 1,
   wherein, among a memory element group including the plurality of memory elements, are included a first memory element having a reset terminal that receives the initialization signal and a second memory element having a set terminal that receives the initialization signal, the reset terminal configured to control the first memory element to store a value of a first logic level upon receipt of the initialization signal, and the set terminal configured to control the second memory element to store a value of a second logic level upon receipt of the initialization signal.

3. The semiconductor device according to claim 1,
wherein each of the plurality of memory elements is a flip-flop or a latch.

4. The semiconductor device according to claim 3,
wherein a memory element group including the plurality of memory elements includes at least one flip-flop and at least one latch.

5. The semiconductor device according to claim 4,
wherein each of the plurality of memory elements has a reset terminal and a set terminal, the reset terminal configured to control the respective memory element to store a value of a first logic level upon receipt of the initialization signal, and the set terminal configured to control the respective memory element to store a value of a second logic level upon receipt of the initialization signal,
wherein a first memory element corresponding to a bit, among the plurality of bits of the fixed data, having a first value receives the initialization signal at only the reset terminal, among the reset terminal and the set terminal, and
wherein a second memory element corresponding to a bit, among the plurality of bits of the fixed data, having a second value differing from the first value receives the initialization signal at only the set terminal, among the reset terminal and the set terminal.

6. The semiconductor device according to claim 5, further comprising:
an output buffer that outputs, to a unit outside of a semiconductor chip, the fixed data outputted from the plurality of memory elements.

7. The semiconductor device according to claim 6, further comprising:
a selector that receives a plurality of information data pieces respectively having a plurality of bits, selects one of the plurality of information data pieces, and feeds the plurality of bits of the selected information data piece to the respective input terminals of the plurality of memory elements.

8. The semiconductor device according to claim 7,
wherein the plurality of memory elements constitute a shift register, and
wherein the shift register successively shifts the plurality of bits of the one information data piece stored in the plurality of memory elements by one bit each, and outputs the bits.

9. The semiconductor device according to claim 8,
wherein the initialization control unit feeds, to the plurality of memory elements, the initialization signal upon receipt of the fixed data setting signal or a power on reset signal.

10. The semiconductor device according to claim 9,
wherein the fixed data is a device ID that is an identifier for identifying a product type.

11. The semiconductor device according to claim 1, further comprising:
a plurality of input selection circuits configured to receive a plurality of input signals at a plurality of respective input terminals and to select one of the plurality of input signals to output at an output terminal according to a selection signal, the plurality of input selection circuits configured to receive as a first input at a first input terminal chip identification (ID) information from an ID storage unit and as a second input at a second input terminal data read out from a memory cell array,
wherein the output terminals of the plurality of input selection circuits is connected to a respective input terminal of a respective one of the plurality of memory elements.

12. A semiconductor device, comprising:
a plurality of input selection circuits configured to receive a plurality of input signals at a plurality of respective input terminals and to select one of the plurality of input signals to output at an output terminal according to a selection signal, the plurality of input selection circuits configured to receive as a first input at a first input terminal chip identification (ID) information from an ID storage unit and as a second input at a second input terminal data read out from a memory cell array; and
a plurality of memory elements, each having a first input terminal connected to the respective output terminal of a respective one of the plurality of input selection circuits, such that each memory element stores and outputs a value corresponding to the respective output terminal of the respective one of the plurality of input selection circuits according to a clock signal,
wherein each of the plurality of memory elements further comprises a second input terminal configured to cause the respective memory element to store and output a fixed value based on receiving an initialization signal input,
wherein the fixed value output by at least one of the plurality of memory elements is a different value than at least another of the plurality of memory elements.

13. The semiconductor device according to claim 12,
wherein the semiconductor device is configured to output a first portion of the chip ID information via the plurality of input selection circuits and the plurality of memory elements based on receiving the first portion of the chip ID information at the respective first inputs of the plurality of input selection circuits, and
wherein the semiconductor device is configured to output a second portion of the chip ID information via the plurality of memory elements based on receiving the initialization input signal at the plurality of memory elements.

14. The semiconductor device according to claim 13,
wherein the plurality of input selection circuits is configured to receive the first portion of the chip ID information in parallel from the memory cell array, and
wherein the plurality of memory elements is configured to output the first portion of the chip ID information and the second portion of the chip ID information in a serial manner.

15. The semiconductor device according to claim 13,
wherein the plurality of input selection circuits is configured to receive the first portion of the chip ID information in parallel from the memory cell array, and
wherein the plurality of memory elements is configured to output the first portion of the chip ID information and the second portion of the chip ID information in parallel from a plurality of data output terminals.

* * * * *